(12) United States Patent
Ohmi et al.

(10) Patent No.: US 7,331,695 B2
(45) Date of Patent: Feb. 19, 2008

(54) VISIBLE LIGHT-REFLECTING MEMBER

(75) Inventors: Tadahiro Ohmi, Miyagi (JP); Akihiro Morimoto, Miyagi (JP); Naoki Tanahashi, Miyagi (JP)

(73) Assignee: Foundation for Advancement of International Science, Ibaraki Prefecture (JP)

( * ) Notice: Subject to any disclaimer, the term of this patent is extended or adjusted under 35 U.S.C. 154(b) by 163 days.

(21) Appl. No.: 10/547,693

(22) PCT Filed: Feb. 27, 2004

(86) PCT No.: PCT/JP2004/002362

§ 371 (c)(1),
(2), (4) Date: Oct. 26, 2005

(87) PCT Pub. No.: WO2004/079409

PCT Pub. Date: Sep. 16, 2004

(65) Prior Publication Data

US 2006/0215409 A1 Sep. 28, 2006

(30) Foreign Application Priority Data

Mar. 3, 2003 (JP) .............................. 2003-056235

(51) Int. Cl.
*F21V 7/00* (2006.01)

(52) U.S. Cl. ...................... 362/341; 362/296; 362/347; 362/348

(58) Field of Classification Search ..................... None
See application file for complete search history.

(56) References Cited

U.S. PATENT DOCUMENTS

| 4,190,321 | A  | * | 2/1980  | Dorer et al.    | 359/581 |
|-----------|----|---|---------|-----------------|---------|
| 6,737,668 | B2 | * | 5/2004  | Den et al.      | 257/9   |
| 6,825,895 | B2 | * | 11/2004 | Nakano et al.   | 349/63  |
| 6,933,041 | B2 | * | 8/2005  | Katsir et al.   | 428/210 |
| 6,950,155 | B2 | * | 9/2005  | Umemoto         | 349/61  |
| 7,033,679 | B2 | * | 4/2006  | Okura et al.    | 428/687 |

FOREIGN PATENT DOCUMENTS

| JP | 6-283411    | A | 10/1993 |
|----|-------------|---|---------|
| JP | 8-304614    | A | 11/1996 |
| JP | 11-65613    | A | 3/1999  |
| JP | 2001-281426 | A | 10/2001 |
| JP | 2001-281446 | A | 10/2001 |
| JP | 2002-116436 | A | 4/2002  |
| JP | 2002-339084 | A | 11/2002 |

* cited by examiner

*Primary Examiner*—Sharon E. Payne
*Assistant Examiner*—Kristen A Manskar
(74) *Attorney, Agent, or Firm*—Foley & Lardner LLP

(57) ABSTRACT

A visible light-reflecting member is disclosed which uses a plate or a film for reflecting visible lights, whose reflective surface is provided with an aluminum thin film having an aluminum purity of not less than 99 mass % and an X-ray diffraction pattern wherein, among peak intensities ascribed to aluminum, the peak intensity ascribed to the (111) plane is higher than the total of the other peak intensities.

19 Claims, 2 Drawing Sheets

VISIBLE LIGHT-REFLECTING MEMBER

CROSS-REFERENCE TO RELATED PATENT APPLICATIONS

Japanese Application 2003-56235, filed Mar. 3, 2003 including the specification, drawings, claims and abstract, is incorporated herein by reference in its entirety. This application is a U.S. National Stage of PCT/JP2004/002362, filed Feb. 27, 2004, including the specification, drawings, claims and abstract, is incorporated herein by reference in its entirety.

TECHNICAL FIELD

This invention relates to a reflecting member used for reflecting a visible light source and, in particular, relates to a visible light reflecting member suitable as a reflecting plate for use in a backlight unit for a large-size flat panel liquid crystal display having a screen diagonal of 28 inches or more.

BACKGROUND ART

A reflecting plate is used for reflecting a visible light source. The reflecting plate contains a diffuse reflecting plate applied with white paint or containing diffusing beads, a polished metal plate, and a reflecting plate in the form of a thin film obtained by stacking metal atoms on a substrate.

These visible light reflecting plates are widely used in various applications such as a backlight unit for a liquid crystal display, a reflecting plate for an indoor fluorescent lamp, a reflective layer of a recording medium such as a CD or a DVD, and a vehicle or indoor mirror.

Recently, large-size flat panel displays have increased in demand in place of current CRT displays. Herein, the large-size flat panel display normally represents a normal type (4:3) or wide type (16:9) flat panel display having a display diagonal of 28 inches or more.

The large-size flat panel displays mainly include a plasma display and a liquid crystal display but, in terms of low power consumption and light weight, the large-size flat panel liquid crystal displays have rapidly increased in demand.

Since the large-size flat panel liquid crystal display is not the self light emitting type like the plasma display, a light emitting portion called a backlight unit is inevitably required on a back side. The backlight unit is provided therein with a cold cathode fluorescent lamp (CCFL) for light emission, a reflecting plate, and various optical sheets.

Normally, a flat panel liquid crystal display of 25 inches or less employs, as a structure of a backlight unit, the sidelight type where a light guide plate made of transparent resin is used with a CCFL disposed on the side. However, in the large-size flat panel liquid crystal display of 28 inches or more, a light guide plate to be used increases in size and therefore increases in thickness and weight and thus in cost. Accordingly, the large-size flat panel liquid crystal display employs the right-under type where a CCFL is disposed right under a liquid crystal panel with a reflecting plate arranged behind it.

Presently, as the reflecting plate for the large-size flat panel liquid crystal display backlight unit, use is made of a diffuse reflecting plate applied with white paint or containing diffusing beads.

The reason for using such a reflecting plate is that because of diffuse reflection, there is no directivity in reflecting light and therefore it is possible to minimize luminance nonuniformity in the display screen. However, since no directivity exists in reflecting light, much light disappears on the wall surfaces and so on and thus the utilization efficiency of light is low. Consequently, for example, in a flat panel display having a screen diagonal of 30 inches, it is necessary to use at least 12 CCFLs for achieving the luminance. As a result, there is a drawback of increasing the power consumption.

In order to reduce the number of CCFLs to be used as much as possible to thereby diminish the power consumption, a reflecting plate is required that can control the light reflection direction, i.e. light directivity, to utilize the light efficiently.

In order to give the directivity to reflecting light, it is necessary to use reflection by a metal surface. With respect to a metal reflecting plate, it has been demonstrated in natural science that an angle formed by a light incidence direction and a perpendicular to a reflective surface, i.e. a light incidence angle, and an angle formed by a light outgoing direction and the perpendicular to the reflective surface, i.e. an outgoing angle, are equal to each other and, therefore, the reflection direction can be freely controlled based on a design for the reflective surface.

Normally, use is made of aluminum or silver as a metal component for uniformly reflecting visible light with respect to respective wavelengths. Although copper or gold is a metal, copper or gold has a property of absorption of low-wavelength light by itself. As a result, reflecting light is colored so that it is not preferable.

A metal reflecting plate is a reflecting plate using a metal and is increased in reflectance by rolling, polishing, and aging a case metal ingot. In this case, since silver is quite expensive, an aluminum ingot is normally used.

With respect to an aluminum reflecting plate formed by rolling an aluminum ingot, Japanese Unexamined Patent Application Publication (JP-A) No. 2001-281426 (hereinafter referred to as reference document 1) reports about ultraviolet reflection that the reflectance of 350 nm ultraviolet light becomes 95% by setting an aluminum purity to 99 mass % or more, setting the ratio of (220) plane/(200) plane or the ratio of (111) plane/(200) plane to 1.0 or more in X-ray diffraction intensity ratio, and setting the ratio of the total area of (110) planes and (111) planes in the surface of the plate to 30% or more, but does not report a reflectance exceeding 92% with respect to light in the range of 400 nm or more being the visible light range.

In order for a reflecting plate for a large-size flat panel liquid crystal display backlight unit to use, efficiently and without luminance nonuniformity, light emitted from a CCFL serving as a light source, the reflecting plate itself needs to be formed with a fine surface structure that is calculated to control the direction of reflecting light. When use is made of an aluminum reflecting plate formed by rolling an ingot, it is necessary, for forming the fine surface structure, to carve such a structure per plate and further it is difficult to accurately control the surface roughness of a reflecting substantially flat or curved surface.

Further, since aluminum has a high specific gravity of 2.71, the weight of the reflecting plate itself becomes large in the case of the aluminum reflecting plate formed by rolling the ingot and therefore it is difficult to actually use it as the reflecting plate in the backlight unit for the large-size flat panel liquid crystal display requiring an reduction in weight.

For reducing the weight of a reflecting plate itself, a reflecting plate has been developed which uses a metal thin film. As a base material (substrate) of the reflecting plate, it is preferable to use a plastic material in view of the point that it is lightweight, enables formation of a fine surface shape with high accuracy, and further enables mass production at a low price by the use of a molding method such as injection molding.

There is a reflecting plate using a thin film of silver as a metal excellent in reflectance. This silver thin film reflecting plate has recently started to be used as a reflecting plate excellent in reflection efficiency, i.e. having a reflectance of 97%.

However, silver itself is expensive and has a drawback of reacting with a very small amount of sulfide (sulfur dioxide or hydrogen sulfide) in the air so as to be blackened and reduced in reflectance. Further, it is necessary to apply various coatings on the silver thin film so that the silver thin film reflecting plate becomes more expensive and thus is not suitable as the reflecting plate for the backlight unit for the large-size flat panel liquid crystal display having a large area.

Therefore, an aluminum thin film is suitable for the reflecting plate for the large-size flat panel liquid crystal display backlight unit.

For forming the aluminum thin film, use is normally made of a deposition method in which aluminum is sublimated in high vacuum and adhered to a base material substrate. The aluminum thin film formed by this method follows a fine surface shape formed on the base material substrate and therefore it is possible to reproduce the fine surface shape as it is to thereby control the directivity of reflecting light.

However, the aluminum thin film formed by the conventional deposition method is amorphous so that configuration on an atomic level is not elaborate, and therefore, it is not possible to improve the reflectance to 92% or more.

For improving the reflectance of the aluminum thin film formed by the deposition method, a method is to realize a reflectance of 95% or more by stacking in layers a dielectric such as $SiO_2$ or MgF on the aluminum surface (reflection increasing coating).

However, a problem has been that the method is not practical because those films should be formed in a number of layers on the aluminum thin film so that the members and processes increase in number to raise the cost and because it is quite difficult to uniformly perform such coating.

Further, it has conventionally been difficult to form a practical flat or curved surface portion having a surface roughness (Ra) of 40 nm or less and, in addition, difficult to implement uniform formation of a deposition thin film itself over the whole surface of the substrate following the increase in size thereof. Consequently, even if the calculated fine surface shape is formed to control the reflecting light, the luminance nonuniformity cannot be completely controlled.

As measures for forming an aluminum thin film, a sputtering method has conventionally been known in which argon ions produced from an argon plasma are irradiated onto an aluminum target under reduced pressure to thereby irradiate aluminum ions onto a base material substrate placed at a counter electrode so as to stack the aluminum ions thereon.

With respect to the aluminum thin film formed by such a conventional sputtering method, since the aluminum ions having energy are irradiated and stacked, the aluminum formed into the film is crystallized so that it is possible to form the film that is elaborate on an atomic level as compared with the deposited film.

However, a drawback has been that the thin film formed by the conventional sputtering method as described above is subjected to polycrystallization, i.e. a number of crystal plane orientations appear on the film surface and spaces are formed among crystals, and therefore, a completely elaborate film cannot be formed so that the reflectance has an upper limit of about 92% like the deposited film.

The present inventors recognize that it is necessary to match the plane orientations in order to further improve the reflectance.

It is known that aluminum easily reacts with oxygen in the air to form a stable natural aluminum oxide coating film having a thickness of about 10 nm and becomes reluctant to corrode by the formation of the natural aluminum oxide coating film.

However, since the natural aluminum oxide coating film is formed by the molecular oxidation reaction, the film is not uniformly oxidized to the inside so that the film thickness becomes unequal and, further, since the chemical composition near the aluminum interface after the oxidation is not stoichiometric, i.e. lacking oxygen atoms, it is the film with many defects and is not fully capable of stress relaxation and, as a result, the inside aluminum layer is subjected to corrosion and therefore it cannot sufficiently serve as a protective layer.

Further, in order to stabilize an aluminum thin film, a method is to form a thick passive film by anodic oxidation or the like. Aluminum formed with an oxide film by the anodic oxidation method is called alumite and widely used.

However, since the aluminum anodically oxidized film is formed by the oxidation caused by oxygen ions and is a porous oxide film having microholes due to a manufacturing method, a stress remains to cause occurrence of microcracks due to a change in external environment such as temperature and humidity, and moisture or the like infiltrates into the microholes. Therefore, the aluminum anodically oxidized film cannot completely prevent corrosion of an aluminum layer.

Also a method exists which improves corrosion resistance by plasma-polymerizing an organic compound such as trimethyldisiloxane and using it as a coating. However, this method not only reduces the reflectance and increases the processes and members in number to raise the cost, but also makes it impossible to accurately reproduce the fine surface shape for controlling the light reflection direction, and therefore, is not appropriate.

To this end, it has been necessary to directly form a uniform and elaborate passive coating film on an aluminum thin film.

It is an object of this invention to provide a visible light reflecting plate or film having an aluminum thin film with a reflectance higher than that of a conventional aluminum thin film.

It is another object of this invention to provide a visible light reflecting plate or film using an aluminum thin film that facilitates a direction control of reflecting light.

It is still another object of this invention to provide a visible light reflecting plate or film with an aluminum thin film having a uniform corrosion-resistant surface passive film.

It is yet another object of this invention to provide a visible light reflecting plate or film with an aluminum thin film suitable for a large-size reflecting plate such as a reflecting plate for a large-size flat panel liquid crystal display backlight unit.

DISCLOSURE OF THE INVENTION

According to one aspect of this invention, there is provided a reflecting plate or a reflecting film (hereinafter referred to as a reflecting member), in which with respect to an aluminum thin film for reflecting visible light, a purity of aluminum is 99 mass % or more and, among peaks attributed to the aluminum in X-ray diffraction, the peak intensity attributed to (111) planes is higher than the total of the other peak intensities attributed to the aluminum. Further, this reflecting member exhbits a reflectance exceeding 92% with respect to light in the visible light range.

Further, according to another aspect of this invention, there is provided a reflecting member in which an aluminum thin film is directly oxidized on the basis of oxygen radicals produced by a plasma in a noble gas containing a small amount of oxygen so as to form an aluminum oxide passive coating film, thereby being capable of remarkably improving corrosion resistance while maintaining reflectance.

According to still another aspect of this invention, there is provided a reflecting member in which the foregoing aluminum thin film is formed on at least one surface of a base material substrate made of a material selected from a metal, a glass, a ceramic, and a plastic, and such a surface may have any shape necessary for controlling reflecting light, such as a Fresnel structure or a free-form surface.

According to yet another aspect of this invention, there is provided an aluminum thin film reflecting member which has, on a reflective surface thereof, substantially flat or curved surface portions with a surface roughness (Ra) being $\frac{1}{10}$ or less of 400 nm of a low-wavelength side wavelength in the visible light range. Here, in this invention, an oxide coating film formed on the surface of an aluminum thin film is preferably set to 100 nm or less being $\frac{1}{4}$ or less of 400 nm of the low-wavelength side wavelength in the visible light range in order to prevent coloring due to thin film interference.

According to a further aspect of this invention, there is provided a visible light reflecting member in which a substrate made of a predetermined material is prepared and the substrate is provided thereon with an aluminum thin film in which a purity of aluminum is 99 mass % or more and, among peaks attributed to the aluminum in X-ray diffraction, the peak intensity attributed to (111) planes is higher than the total of the other peak intensities attributed to the aluminum and which exhibits a reflectance exceeding 92% with respect to light in the visible light range.

Further, according to a still further aspect of this invention, there is provided an aluminum thin film reflecting member that enables uniform film formation even with respect to the whole surface of a large-size reflecting plate such as a reflecting plate for a backlight unit of a large-size flat panel liquid crystal display of 28 inches or more.

Moreover, according to a yet further aspect of this invention, there is provided a reflecting member manufacturing method in which an aluminum thin film is plasma-oxidized by the use of oxygen radicals produced by a plasma in a noble gas containing a small amount of oxygen so as to form an aluminum oxide passive coating film, thereby being capable of remarkably improving corrosion resistance while maintaining reflectance.

On the other hand, the intensity ratio of crystal plane orientations in this invention can be derived by measuring peak intensities based on the respective crystal plane orientations according to a normal X-ray diffraction method.

BEST MODE FOR CARRYING OUT THE INVENTION

In assiduously repeating researches on a relationship between aluminum plane orientation and visible light reflectance, the present inventors have carried out sputtering film formation that can control the plane orientation and is capable of uniform film formation even over the whole surface of a large-size substrate and examined the reflectance, and obtained knowledge that selective formation of a particular plane orientation is a very effective means for reliably improving the reflectance in the visible light range. In other words, the present inventors have discovered a technique of causing more (111) planes to remain in a thin film by performing the sputtering film formation under specific conditions, found out that the reflectance in that event is high, and conceived this invention.

Figure 1:
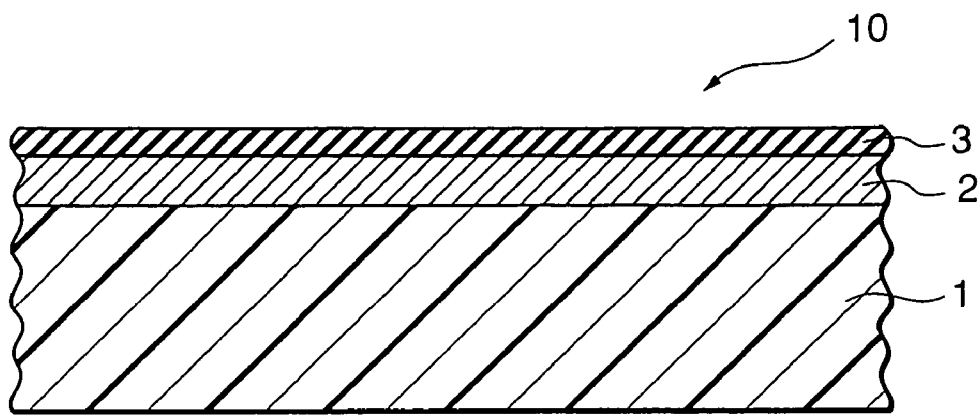
FIG. 1 is a partial schematic sectional view showing one example of a visible light reflecting plate according to an embodiment of this invention.
Figure 2:
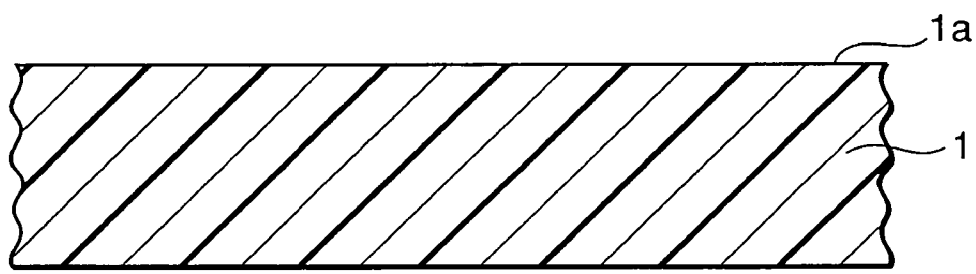
FIG. 2 is a sectional view for use in explaining one process among manufacturing processes of the visible light reflecting plate shown in FIG. 1.
Figure 3:
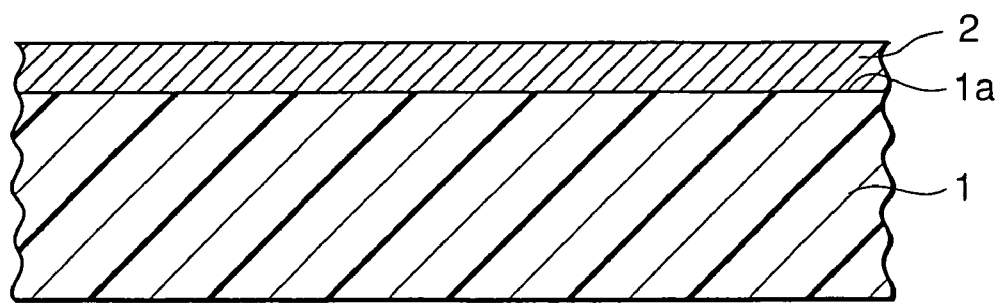
FIG. 3 is a sectional view for use in explaining another process among the manufacturing processes of the visible light reflecting plate shown in FIG. 1.

At first, this invention will be described more specifically. FIG. 1 is a partial schematic sectional view showing one example of a visible light reflecting plate of this invention and FIGS. 2 and 3 are diagrams for explaining manufacturing processes of the visible light reflecting plate in FIG. 1.

A visible light reflecting plate 10 according to an embodiment of this invention shown in FIG. 1 has a reflective layer 2 formed on one surface of a substrate 1. The illustrated substrate 1 has a thickness of 0.7 mm to 2 mm and is made of a plastic material (specifically, cycloolefin polymer; ZEONOR 1600 manufactured by ZEON Corporation). In this example, in order to give light directivity to the reflecting plate, use is made of the substrate 1 having a Fresnel structure with a width of several microns (not shown) on the surface thereof. As a material of the substrate 1, use can be made of a metal, a glass, a ceramic, or another plastic material.

The size and thickness of the substrate are also not limited but, in consideration of a strength as the substrate, the thickness of the substrate is preferably 40 μm or more in the case of a resin having flexibility. In the case of a metal, glass, or ceramic material, the thickness of the substrate is preferably 100 μm or more.

By using the substrate 1 made of such a material, it is possible to intentionally form a concave-convex shape on the surface of the substrate in order to control reflection directivity of the reflective layer.

For example, with respect to a reflecting plate for a large-size flat panel display backlight unit, it is necessary to form a calculated surface fine shape like a Fresnel structure or a free-form surface structure in order to control luminance nonuniformity. The concave-convex shape thereof is normally formed by concave and convex portions of 1 μm or more.

Flat surfaces or curved surfaces are formed between the concave and convex portions. Since the light directivity is defined by substantially flat or curved surface portions thereof, the surface roughness thereof is preferably set to 40 nm or less being 1/10 or less of 400 nm of a low-wavelength side wavelength in the visible light range and more preferably 20 nm or less being 1/20 or less of the wavelength.

The illustrated reflective layer 2 is formed by an aluminum thin film that is mainly (111) plane-oriented. The reflectance can be increased by improving the purity of aluminum. However, when the purity in the aluminum thin film is lower than 99%, the content of other elements increases relatively and, therefore, even in the case of the same plane orientation, lattice distortion increases and, further, since light energy absorption by the other elements increases, the reflectance decreases. Therefore, the aluminum purity is required to be 99 mass % or more and more preferably 99.5 mass % or more.

In X-ray diffraction measurement, it is possible that peaks other than attributed to aluminum are observed due to an influence of the substrate. However, strictly, the intensity ratio of only those peaks attributed to aluminum is important and no consideration is given to the peaks other than attributed to aluminum. The peaks attributed to aluminum are peaks based on the plane orientations thereof and summarized as in Table 1.

TABLE 1

| dA | I/II | hkl | 2θ(Cukα2) |
|---|---|---|---|
| 2.338 | 100 | 111 | 38.6 |
| 2.024 | 47 | 200 | 44.9 |
| 1.431 | 22 | 220 | 65.3 |
| 1.221 | 24 | 311 | 78.5 |
| 1.169 | 7 | 222 | 82.7 |
| 1.0124 | 2 | 400 | 99.4 |
| 0.9289 | 8 | 331 | 112.45 |
| 0.9055 | 8 | 420 | 117.02 |
| 0.8266 | 8 | 422 | 138.18 |

*With respect to 2θ, ±2° of the foregoing values are considered to be errors caused by the measurement conditions (substrate setting manner) and so on.

As a result of the X-ray diffraction measurement on the visible light reflecting plate 10 according to the embodiment of this invention, it has been confirmed that the 2θ peak attributed to aluminum exists alone only near 38.5°±2° with respect to the subject aluminum thin film. Since this peak is attributed to the plane orientation (111) of aluminum, it has been made clear that the illustrated aluminum thin film is mainly (111) plane-oriented.

From the examination result according to this invention, it has been found that when the plane orientations of the aluminum thin film are matched, the defect in the film decreases and the surface flatness is remarkably improved. Specifically, in order to improve the reflectance of the reflecting plate of this invention, it is preferable that the peak intensity of the (111) planes be higher than the total of the peak intensities of the other plane orientations and it is more preferable that the peak intensity of the (111) planes in X-ray diffraction be 500 cps or more and further preferably 1000 cps or more.

On the surface of the aluminum thin film reflective layer 2, there is formed a direct oxide coating film protective layer 3 in the form of an aluminum oxide ($Al_2O_3$) film 3 having a surface average pinhole pitch of 700 nm or more.

As also clear from this, the illustrated visible light reflecting plate 10 is composed of the substrate 1, the aluminum reflective layer 2 formed on the surface of the substrate 1, and the aluminum oxide protective film 3 formed on the reflective layer 2.

In the visible light reflecting plate 10 according to the embodiment of this invention, the aluminum oxide film formed as the aluminum protecting layer 3 has a thickness of 40 nm or less (preferably 1 nm to 100 nm) and an average pinhole pitch of 700 nm or more on the surface.

That is, it is understood that the illustrated aluminum oxide film is a film being uniform and having substantially no pinholes with respect to the visible light. This aluminum oxide film 3 is formed by a plasma oxidation method using a noble gas such as Ar or Kr and a very small amount of oxygen.

The noble gas component added with the very small amount of oxygen reduces the stress of the oxide film to thereby make microcracks difficult to occur and, therefore, not only the durability of the film is improved but also the inside aluminum layer can be completely protected from the external environment.

Now, a method of manufacturing the visible light reflecting plate 10 according to the embodiment of this invention will be described with reference to the drawings. At first, description will be made as regards the formation of the aluminum thin film.

As shown in FIG. 2, on the surface of a plastic substrate 1 made of cycloolefin polymer and having a thickness of 0.7 mm to 2 mm, a Fresnel structure 1a with transferred ruggedness of a several-micron width was formed in order to give light directivity to a reflecting plate to be manufactured.

A sputtering film formation was performed by using an aluminum target with a purity of 5N or more and applying a bias of −20V to the substrate 1, thereby drawing argon ions produced by a plasma toward the Fresnel structure surface 1a and irradiating them onto the sputtering surface of the substrate 1. By this, only the (111) planes remain on the surface so that there was obtained a reflective layer 2 in the form of an aluminum thin film having a thickness of 50 nm to 500 nm and highly oriented so as to be (111) plane-oriented (FIG. 3).

By highly purifying a sputtering atmosphere, the reflective layer 2 can be prevented from contamination due to impurities (moisture etc.). Further, by performing the sputtering film formation, there was formed on the surface of the substrate 1 the reflective layer 2 in the form of the aluminum thin film accurately reproducing the fine shape such as the Fresnel shape formed on the substrate 1.

The aluminum thin film 2 shown in FIG. 3 had a thickness of 100 nm. Further, it was confirmed that the peak attributed to the (111) planes was observed with respect to the aluminum thin film 2 and the aluminum thin film 2 had a surface roughness Ra of 1 μm and an absolute reflectance of 99%.

From the examination result according to this invention, it is preferable that the aluminum thin film be formed by the sputtering method. By applying the bias to the substrate in the sputtering, the sputtering surface is irradiated with low ions so that unstable plane orientations are removed, and therefore, the thin film resultantly (111) plane-oriented is formed, which is thus preferable.

The bias applied to the substrate is preferably not less than −60V and not more than −5V and more preferably not less than −40V and not more than −10V. The ion irradiation energy required in that event is a low energy of 80 eV to 15 eV, preferably 80 eV to 25 eV.

As a power supply for the bias applied to the substrate, either DC or RF can be used because it is sufficient that the potential on the substrate be defined.

The sputtering is preferably performed at a pressure of 50 mTorr or less so that aluminum ions forced out of the target are perpendicularly irradiated onto the substrate. On the other hand, the sputtering is preferably performed at a pressure of 1 mTorr or more so as not to make unstable the plasma to be produced.

The plasma to be produced is preferably a plasma of a noble gas such as argon, xenon, or krypton.

The purity of the target material for the sputtering is preferably higher and more preferably 5N or more.

It is preferable to use the RF power for a cathode in order to stably produce the plasma. Further, it is preferable to use a magnet in order to stably produce the plasma on the cathode side. It is more preferable to apply the negative DC bias in order to efficiently draw the argon ions to the target to increase the sputtering rate.

Then, as shown in FIG. 1, the aluminum film 2 was formed with a protective layer 3 in the form of an aluminum oxide film.

At first, after the sputtering film formation of the aluminum thin film, the surface of the aluminum thin film 2 was plasma-oxidized in a krypton atmosphere containing a small amount of oxygen in a volume ratio ($Kr/O_2=97/3$) without exposing the substrate 1 to the atmosphere by the use of a cluster tool forming a vacuum system.

In the plasma oxidation according to this invention, a small amount of a noble gas such as argon, xenon, or krypton is used to produce a plasma by the RF power and the direct oxidation is carried out by the use of the produced oxygen plasma, thereby forming an elaborate and uniform oxide film. The aluminum oxide film 3 thus obtained contained the noble gas element and had a thickness of 5 nm.

Further, a change in mirror reflectance after a high-temperature high-humidity environment test at 60° C. and 90% Rh was 0%. This is because since a very small amount of the noble gas (Kr) used in the formation exists in the oxide film, a stress of the oxide film is relaxed to thereby suppress occurrence of microcracks being a defect caused by the environment change (change in temperature and humidity) and therefore the corrosion resistance of aluminum is improved.

From this, it has been confirmed with respect to the visible light reflecting plate according to the embodiment of this invention that even when the aluminum thin film being the reflective layer 2 is formed with the aluminum oxide film 3, the reflectance of the reflective layer 2 does not change.

Since the natural oxide film according to the conventional technique is formed by the molecular oxygen oxidation, the reaction is nonuniform so that unevenness in film thickness is liable to occur and, since the chemical composition near the interface is stoichiometrically insufficient, the defect near the interface increases so that the stress remains to cause occurrence of microcracks.

On the other hand, the aluminum oxide film by the plasma oxidation formed in this invention is formed by very mild radical oxygen oxidation with low plasma electron density.

Therefore, when the aluminum oxide film is formed by the foregoing plasma oxidation, reaction uniformly proceeds with surface layer atoms of the aluminum thin film to provide the stoichiometric composition near the interface and therefore the defect decreases to relax the stress to thereby suppress occurrence of microcracks so that it is possible to prevent invasion of the cause for aluminum corrosion such as moisture from the exterior.

When the aluminum surface after the sputtering is exposed to the atmosphere, a natural oxide film is produced due to moisture and oxygen in the atmosphere so that the film quality is degraded. In order to maintain the film quality, use is made of the cluster tool or the like so as not to expose the aluminum surface to the atmosphere after the sputtering, thereby preventing formation of the natural oxide film on the surface of the aluminum layer before the plasma oxidation to thereby stoichiometrically maintain the chemical composition near the interface to prevent occurrence of the defect near the interface, which can protect aluminum that is poor in corrosion resistance.

Further, in the embodiment of this invention, because of the direct oxidation of the aluminum thin film, it is possible to accurately hold the aluminum thin film surface that has accurately reproduced the fine shape such as the Fresnel shape formed on the substrate.

Figure 4:
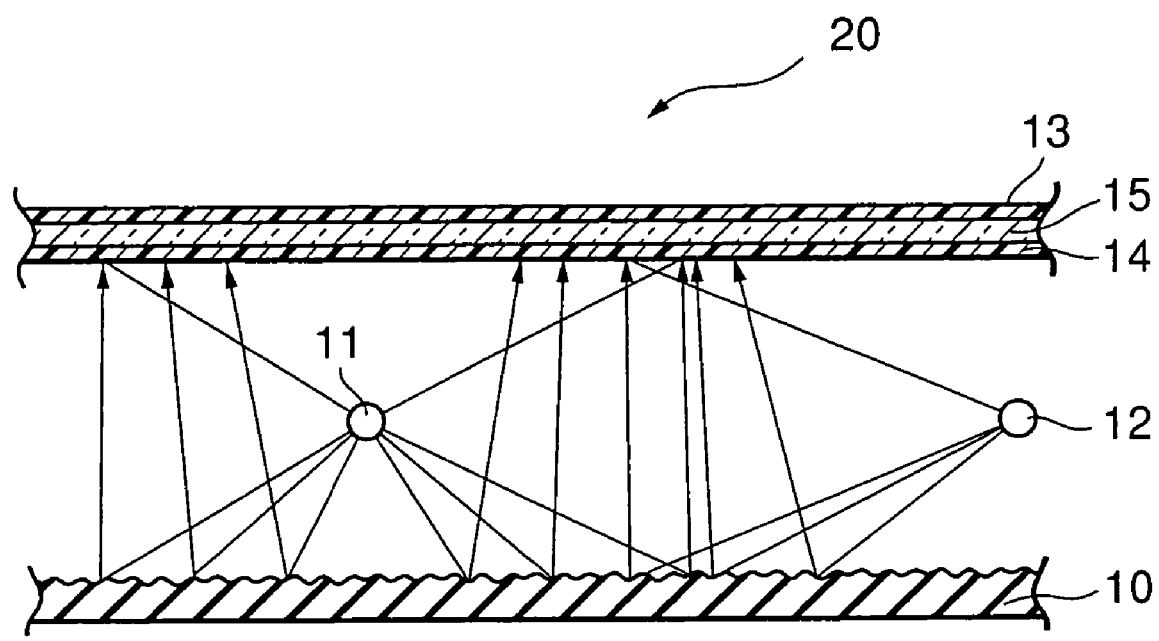
FIG. 4 is a sectional view showing an application example of the visible light reflecting plate in FIG. 1.

Referring to FIG. 4, description will be given of a backlight unit for a large-size flat panel liquid crystal display using the visible light reflecting plate 10 of this invention. The illustrated backlight unit 20 comprises cold cathode fluorescent lamps (CCFLs) 11 and 12, a diffusion plate 15 located above the CCFLs 11 and 12 with an interval therebetween, and diffusion coatings 13 and 14 applied to the front and back sides of the diffusion plate 15. Further, the visible light reflecting plate 10 of this invention is disposed so as to face the diffusion plate 15 with the CCFLs 11 and 12 interposed therebetween. Herein, it is assumed that the foregoing visible light reflecting film and surface protecting film are formed on the substrate made of the plastic material and having the Fresnel structure.

In the illustrated backlight unit 20, as shown by arrows, light from the adjacent CCFLs 11 and 12 is reflected with the maximum reflection intensity by the reflective surface of the visible light reflecting plate 10 of this invention having (111) as the main plane orientation. Further, since the visible light reflecting plate 10 carries out reflection equal to that of a concave mirror because of the Fresnel structure thereof, reflected light is incident on the diffusion plate 15 without spreading and therefore much brighter full-surface light can be obtained. Therefore, the illustrated backlight unit is optimal for a large-size flat panel liquid crystal display backlight unit. Further, the required number of CCFLs can be reduced than conventional so that energy saving for the display can be achieved.

As described above, according to this invention, it is possible to provide the visible light reflecting plate excellent in corrosion resistance that reliably realizes the mirror reflectance higher than that of the conventional reflecting plate (i.e. the reflectance exceeding 92%) and that does not require the thick aluminum oxide layer or the coating of the other material as opposed to the conventional reflecting plate, and the manufacturing method of such a visible light reflecting plate.

INDUSTRIAL APPLICABILITY

As described above, a visible light reflecting member according to this invention is suitable as a reflecting plate for use in a backlight for a liquid crystal display device, particularly in a backlight unit for a large-size flat panel liquid crystal display having a screen diagonal of 28 inches or more.

The invention claimed is:

1. A visible light reflecting member using a plate or a film for visible light reflection, said plate or film having a reflective surface provided with an aluminum thin film in which a purity of aluminum is 99 mass % or more and, among peaks attributed to the aluminum in X-ray diffraction, the peak intensity attributed to (111) planes being higher than the total of the other peak intensities attributed to the aluminum, said plate or film having a Fresnel structure formed on said reflective surface.

2. A visible light reflecting member having substantially flat or curved surface portions with a surface roughness (Ra) of 40 nm or less on a reflective surface thereof and using an aluminum thin film for visible light reflection, said reflective surface being formed on a substrate having a Fresnel structure.

3. A visible light reflecting member according to claim 1, wherein said aluminum thin film is provided on a substrate made of a plastic material.

4. A visible light reflecting member according to claim 3, wherein an oxide coating film is directly formed on a surface of said aluminum thin film by plasma oxidation.

5. A visible light reflecting member according to claim 1, wherein an oxide coating film of 100 nm or less is directly formed on a surface of said aluminum thin film.

6. A visible light reflecting member according to claim 5, wherein said oxide coating film formed contains a very small amount of a noble gas component.

7. A method of manufacturing visible light reflecting member comprising the steps of applying a potential of −60V to −5V to a substrate in the form of a plate or a film to be formed thereon with an aluminum thin film and irradiating ions with a low energy of 80 eV to 15 eV, thereby forming the aluminum thin film by a sputtering method, said substrate having a Fresnel structure on which said aluminum thin film is formed.

8. A method of manufacturing visible light reflecting member according to claim 7, further comprising the step of forming an oxide coating film of 100 nm or less by the use of radical oxygen directly on a surface of said aluminum thin film formed.

9. A method of manufacturing an aluminum thin film visible light reflecting member comprising the steps of:

forming an aluminum thin film on a substrate in the form of a plate or a film, said substrate having a Fresnel structure on which the aluminum film is formed; and oxidizing said aluminum thin film by the use of oxygen radicals produced by a plasma in a noble gas containing a small amount of oxygen, thereby forming an oxide film on a surface of said aluminum thin film.

10. A large-size flat panel liquid crystal display having a screen diagonal of 28 inches or more, wherein the visible light reflecting member according to claim 1 is incorporated into a backlight unit.

11. A visible light reflecting member according to claim 2, wherein said aluminum thin film is provided on a substrate made of a plastic material.

12. A visible light reflecting member according to claim 11, wherein an oxide coating film is directly formed on a surface of said aluminum thin film by plasma oxidation.

13. A visible light reflecting member according to claim 2, wherein an oxide coating film of 100 nm or less is directly formed on a surface of said aluminum thin film.

14. A visible light reflecting member according to claim 13, wherein said oxide coating film formed contains a very small amount of a noble gas component.

15. A large-size flat panel liquid crystal display having a screen diagonal of 28 inches or more, wherein the visible light reflecting member according to claim 2 is incorporated into a backlight unit.

16. A large-size flat panel liquid crystal display having a screen diagonal of 28 inches or more, wherein the visible light reflecting member according to claim 3 is incorporated into a backlight unit.

17. A large-size flat panel liquid crystal display having a screen diagonal of 28 inches or more, wherein the visible light reflecting member according to claim 4 is incorporated into a backlight unit.

18. A large-size flat panel liquid crystal display having a screen diagonal of 28 inches or more, wherein the visible light reflecting member according to claim 5 is incorporated into a backlight unit.

19. A large-size flat panel liquid crystal display having a screen diagonal of 28 inches or more, wherein the visible light reflecting member according to claim 6 is incorporated into a backlight unit.

* * * * *